United States Patent
Kim et al.

(10) Patent No.: US 7,432,640 B2
(45) Date of Patent: Oct. 7, 2008

(54) PLASMA DISPLAY APPARATUS HAVING COVER MEMBERS FOR SIGNAL TRANSMISSION MEMBERS

(75) Inventors: Ki-Jung Kim, Suwon-si (KR); Sung-Won Bae, Suwon-si (KR)

(73) Assignee: Samsung SDI Co., Ltd., Suwon-si, Gyeonggi-do (KR)

( * ) Notice: Subject to any disclaimer, the term of this patent is extended or adjusted under 35 U.S.C. 154(b) by 150 days.

(21) Appl. No.: 11/246,263

(22) Filed: Oct. 11, 2005

(65) Prior Publication Data
US 2006/0082273 A1   Apr. 20, 2006

(30) Foreign Application Priority Data
Oct. 15, 2004   (KR)   ............... 10-2004-0082577

(51) Int. Cl.
*H01J 1/02*   (2006.01)
(52) U.S. Cl. ........................... 313/46; 313/582
(58) Field of Classification Search ............ 313/46, 313/582–587
See application file for complete search history.

(56) References Cited

U.S. PATENT DOCUMENTS

| | | | |
|---|---|---|---|
| 2002/0050788 A1* | 5/2002 | Kimura et al. | 313/582 |
| 2003/0076037 A1* | 4/2003 | Choi | 313/582 |
| 2004/0195969 A1* | 10/2004 | Kim et al. | 313/583 |
| 2005/0067963 A1* | 3/2005 | Kim et al. | 313/583 |
| 2005/0088071 A1* | 4/2005 | Ahn et al. | 313/46 |
| 2005/0088092 A1* | 4/2005 | Kim et al. | 313/582 |

FOREIGN PATENT DOCUMENTS

| | | |
|---|---|---|
| CN | 1402319 | 3/2003 |
| JP | 2002-124607 | 4/2002 |
| JP | 2002-244568 | 8/2002 |
| JP | 2003-115568 | 4/2003 |
| JP | 2004-096387 | 3/2004 |
| JP | 2004-258473 | 9/2004 |
| KR | 2003-0034764 | 5/2003 |

OTHER PUBLICATIONS

Machine translation of japanese patent 2003-115568, Toyoshi, "Mounting structure of IC chip and display", Apr. 18, 2003.*
Office Action from the Patent Office of the People's Republic of China issued in Applicant's corresponding Chinese Patent Application No. 200510124971.8 dated Apr. 18, 2008.
Japanese office Action dated Jun. 10, 2008 for Applicant's corresponding Japanese Patent Application No. 2005-204603.

* cited by examiner

*Primary Examiner*—Karabi Guharay
*Assistant Examiner*—Bumsuk Won
(74) *Attorney, Agent, or Firm*—Robert E. Bushnell, Esq.

(57) ABSTRACT

A plasma display apparatus comprises: a plasma display panel for displaying images; a chassis base disposed at a rear portion of the plasma display panel; a circuit unit disposed at a rear of the chassis base so as to drive the plasma display panel; a plurality of signal transmission members, each of which includes at least one device, for connecting the plasma display panel and the circuit unit so as to transmit electric signals between them, the signal transmission members being separated from each other; and a plurality of cover members surrounding the devices of the signal transmission members while the devices are separated by respective predetermined distances from the chassis base.

7 Claims, 5 Drawing Sheets

PLASMA DISPLAY APPARATUS HAVING COVER MEMBERS FOR SIGNAL TRANSMISSION MEMBERS

CLAIM OF PRIORITY

This application makes reference to, incorporates the same herein, and claims all benefits accruing under 35 U.S.C §119 from an application for PLASMA DISPLAY APPARATUS earlier filed in the Korean Intellectual Property Office on 15 Oct. 2004 and there duly assigned Serial No. 10-2004-0082577.

BACKGROUND OF THE INVENTION

1. Technical Field

The present invention relates to a plasma display apparatus, and more particularly, to a plasma display apparatus having an improved structure capable of dissipating heat generated by a device installed in a signal transmission member.

2. Related Art

A plasma display apparatus is a flat panel display which displays images using a gas discharge phenomenon, and is highlighted as a next generation flat panel display which can substitute for a cathode ray tube (CRT) since it has excellent display characteristics, such as display capacity, brightness, contrast, residual image, and viewing angle.

The plasma display apparatus includes a plasma display panel, a chassis base disposed in parallel with the plasma display panel, a circuit unit mounted on a rear portion of the chassis base for driving the plasma display panel, and a case for receiving the plasma display panel, the chassis base and the circuit unit.

In the plasma display apparatus, the circuit unit and the plasma display panel are electrically connected by a signal transmission member, such as a tape carrier package (TCP) and a chip on film (COF), for driving the panel. The TCP is formed as a package by mounting a device, for example, a driving integrated circuit (IC), on a tape, and the COF is formed by mounting a device on a film forming a flexible printed cable (FPC). The TCP and COF have flexibility, and are capable of reducing the size of the circuit unit since a plurality of devices can be mounted thereon.

However, in the TCP or COF, a lot of heat is generated from devices mounted on the TCP or COF while driving the plasma display panel, and if the heat cannot be dissipated sufficiently, the devices may malfunction and cause a problem in displaying images on the plasma display panel. In particular, if the plasma display panel is driven in a high definition (HD) single scan mode, the devices mounted on the TCP or COF connecting an address driving unit of the circuit unit and address electrodes generate more heat, and thus a unit for dissipating the heat effectively is required.

SUMMARY OF THE INVENTION

The present invention provides a plasma display apparatus capable of sufficiently dissipating heat from devices mounted on a signal transmission unit and protecting the devices effectively.

According to an aspect of the present invention, a plasma display apparatus comprises: a plasma display panel for displaying images; a chassis base disposed at a rear portion of the plasma display panel; a circuit unit disposed at a back portion of the chassis base for driving the plasma display panel; a plurality of signal transmission members, each of which includes at least one device, for connecting the plasma display panel and the circuit unit so as to transmit electric signals between them, the members being separated from each other; and a plurality of cover members surrounding the devices of the signal transmission members while the devices are separated by respective predetermined distances from the chassis base.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate same or similar components, wherein.

DETAILED DESCRIPTION OF THE INVENTION

Figure 1:
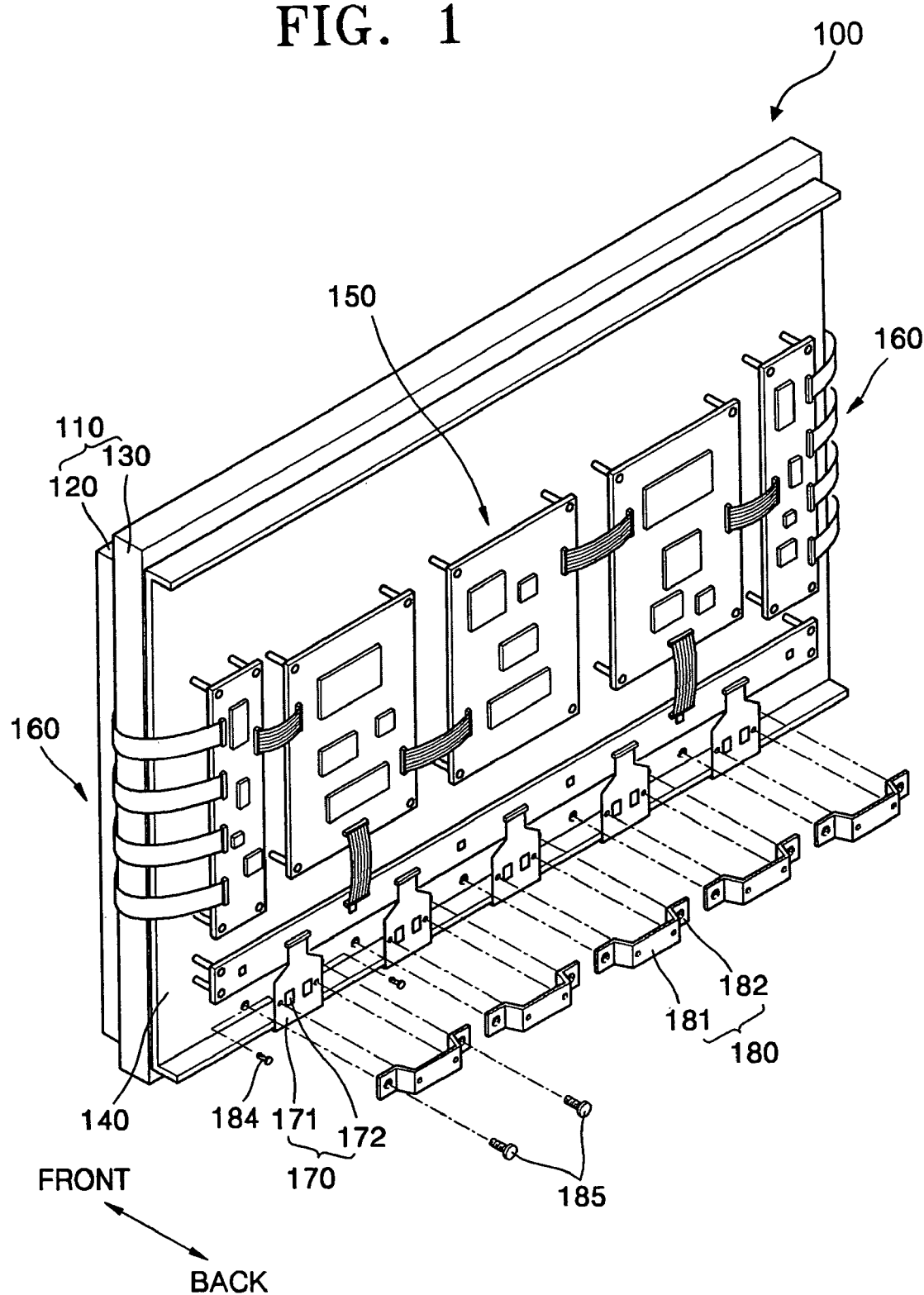
FIG. 1 is an exploded perspective view of a plasma display apparatus according to an embodiment of the present invention.
Figure 2:
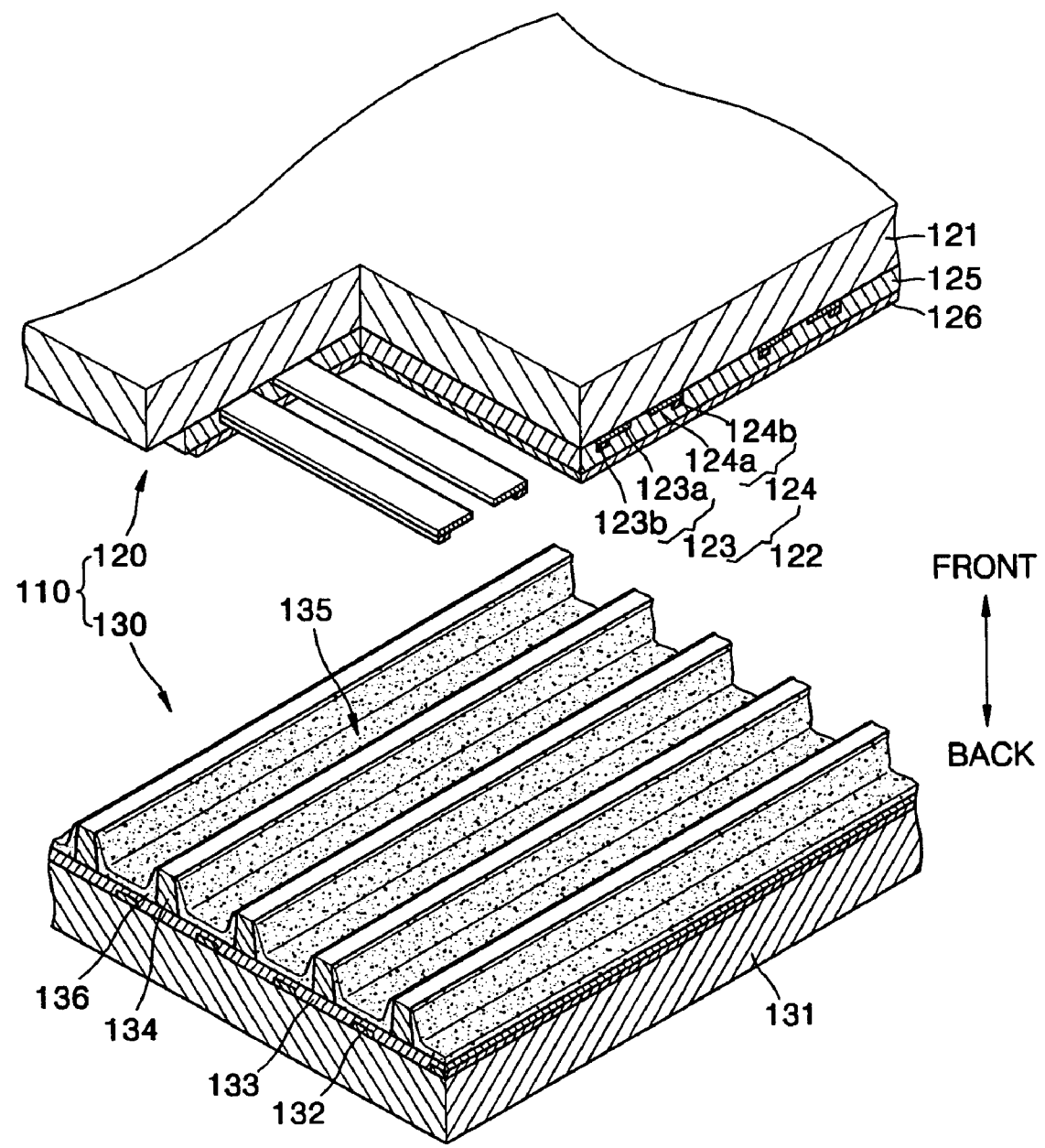
FIG. 2 is a partial perspective view of a plasma display panel shown in FIG. 1.

FIG. 1 is an exploded perspective view of a plasma display apparatus according to an embodiment of the present invention, and FIG. 2 is a partial perspective view of a plasma display panel shown in FIG. 1.

Referring to FIG. 1, the plasma display apparatus 100 includes a plasma display panel 110 for displaying images.

Various kinds of plasma display panels can be used as the plasma display panel 110 of the present invention. For example, an alternating current (AC) type plasma display panel having a surface discharge three-electrode structure can be used, as shown in FIG. 2.

The plasma display panel 110 of FIG. 2 includes a front panel 120 and a back panel 130 coupled to the front panel 120.

The front panel 120 includes a front substrate 121 disposed at a front portion, sustain electrode pairs 122 formed on a back surface of the front substrate 121 and including X electrodes 123 and Y electrodes 124, a front dielectric layer 125 covering the sustain electrode pairs 122, and a protective layer 126 formed on a back surface of the front dielectric layer 125. The X electrode 123 and the Y electrode 124 are separated from each other by as much as a discharge gap. In addition, the X electrode 123 includes an X transparent electrode 123a and an X bus electrode 123b connected to the X transparent electrode 123a, and the Y electrode 124 includes a Y transparent electrode 124a and a Y bus electrode 124b connected to the Y transparent electrode 124a.

The back panel 130 includes a back substrate 131 disposed on a rear portion of the panel 130, address electrodes 132 formed on a front surface of the back substrate 131 and extending in a direction so as to cross the sustain electrode pairs 122, a back dielectric layer covering the address electrodes 132, barrier ribs 134 formed on the back dielectric layer 133 so as to define discharge spaces 135, a phosphor layer 136 disposed in the discharge spaces 135, and a discharge gas filled in the discharge spaces 135. The barrier ribs 134 extend in parallel with the address electrodes 132, and at least one address electrode 132 is disposed between the two neighboring barrier ribs 134. Therefore, regions where the sustain electrode pairs 122 and the address electrodes 132 cross each other can correspond to the discharge spaces 135.

A chassis base 140 is disposed at a rear portion of the plasma display panel 110 having the above structure. The chassis base 140 is formed of aluminum so as to support the plasma display panel 110, and receives and dissipates the heat generated by the plasma display panel 110. An edge of the chassis base 140 is bent toward the rear portion so that the chassis base 140 is not distorted by being bent or curved.

The chassis base 140 is coupled to the plasma display panel 110 by an adhesive member such as a dual-adhesive tape, and a heat dissipation member (not shown) is disposed between the chassis base 140 and the plasma display panel 110 so as to dissipate the heat generated by the plasma display panel 110 to the outside.

In addition, a circuit unit 150 is installed on a rear portion of the chassis base 140, and the circuit unit 150 includes a plurality of electronic elements. The circuit unit 150 drives the plasma display panel 110.

Figure 3:
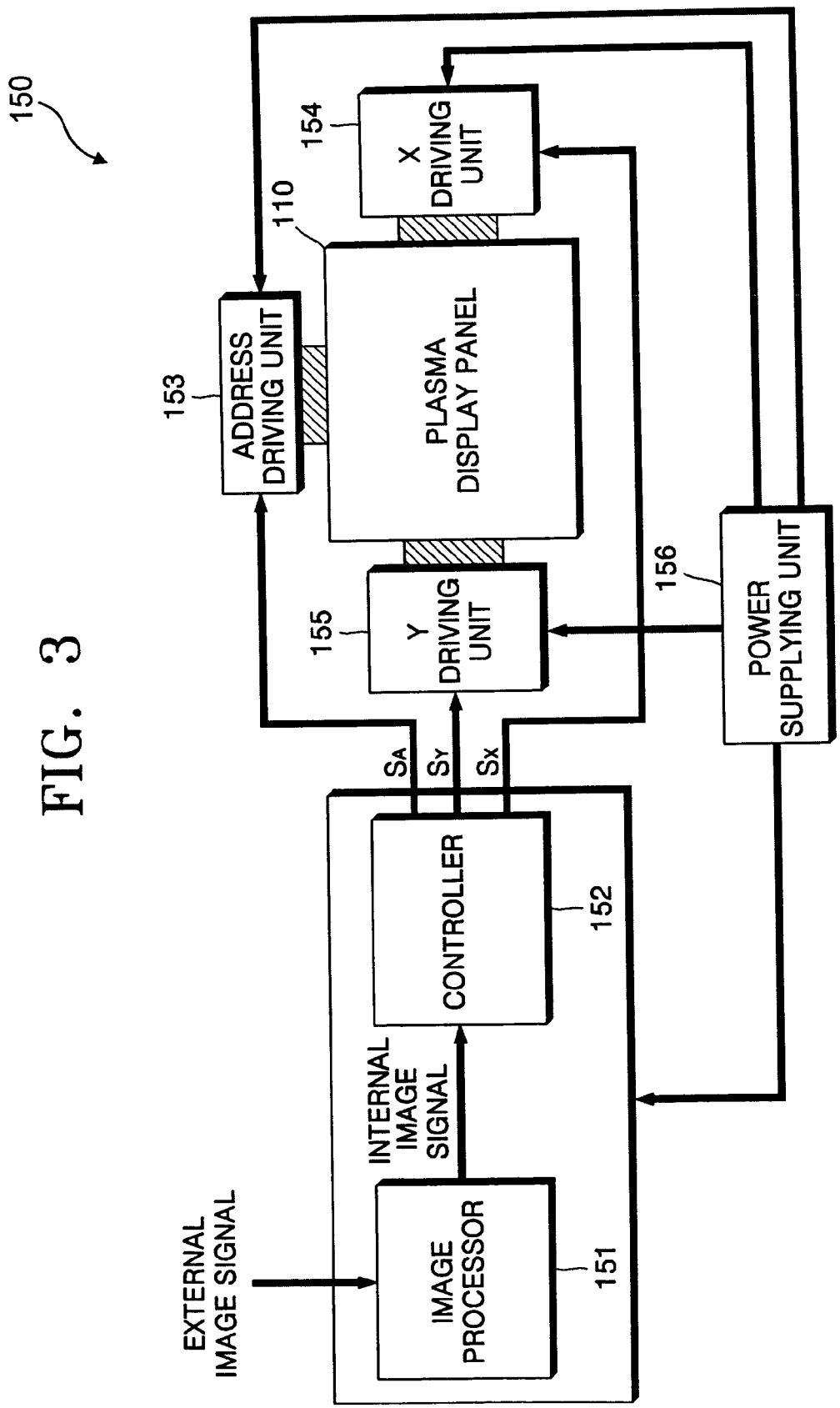
FIG. 3 is a block diagram illustrating operations of a circuit unit shown in FIG. 1.

FIG. 3 is a block diagram illustrating operations of a circuit unit shown in FIG. 1.

Referring to FIG. 3, the circuit unit 150 includes an image processor 151, a logic controller 152, an address driving unit 153, an X driving unit 154, a Y driving unit 155, and a power supplying unit 156.

The image processor 151 converts an external analog image signal into a digital signal so as to generate internal image signals, for example, red, green and blue image data of 8 bits, a clock signal, a vertical synchronization signal, and a horizontal synchronization signal. The logic controller 152 generates driving control signals SA, SY and SX according to the internal image signals of the image processor 151. The address driving unit 153 processes the address signal SA among the driving control signals SA, SY and SX from the logic controller 152 so as to generate a display data signal, and applies the generated display data signal to address electrodes 132. The X driving unit 154 processes the X driving control signal SX among the driving control signals SA, SY and SX from the logic controller 152, and applies the resultant signal to the X electrodes 123. The Y driving unit 155 processes the Y driving control signal SY among the driving control signals SA, SY and SX from the logic controller 152, and applies the resultant signal to the Y electrodes 124.

In addition, the power supplying unit 156 generates and supplies working voltages to the image processor 151 and the logic controller 152, and generates and supplies working voltages to the address driving unit 153, the X driving unit 154, and the Y driving unit 155.

The circuit unit 150 having the above structure is accommodated in a case which includes a front cover and a back cover (not shown) with the plasma display panel 110 and the chassis base 140 to form the plasma display apparatus 100.

The circuit unit 150 transmits the electric signal to the plasma display panel 110 through a signal transmission member. At least one of a flexible printed cable (FPC), a tape carrier package (TCP), and a chip on film (COF) can be selected and used as the signal transmission member. According to the present embodiment, FPCs 160 are adopted as signal transmission members which are disposed at left and right sides of the chassis base 140 and connected to the circuit unit 150. The TCPs 170, each of which is formed by mounting at least a device 172 on a wiring unit 171 of tape type, are adopted as the signal transmission members disposed under the chassis base 140 and connected to the circuit unit 150.

In addition, the TCPs 170 which are disposed under the chassis base 140, and which are separated from each other by predetermined distances, connect the address electrodes 132 and the address driving unit 153 which are constructed to drive the plasma display panel 110 in the HD single scan method.

That is, the wiring units 171 of the TCPs 170 pass through a lower edge of the chassis base 140, end portions of the wiring units 171 are connected to the address electrodes 132 formed on the plasma display panel 110, and the other end portions of the wiring units 171 are connected to the address driving unit 153 of the circuit unit 150. In addition, at least a device 172, such as an address driving IC, is respectively mounted on the wiring units 171 of the TCPs 170, and the devices 172 are disposed at rear edges of the chassis base 140.

The devices 172 of the TCPs 170 are surrounded by a plurality of cover members 180 while being separated from the chassis base 140.

Figure 4:
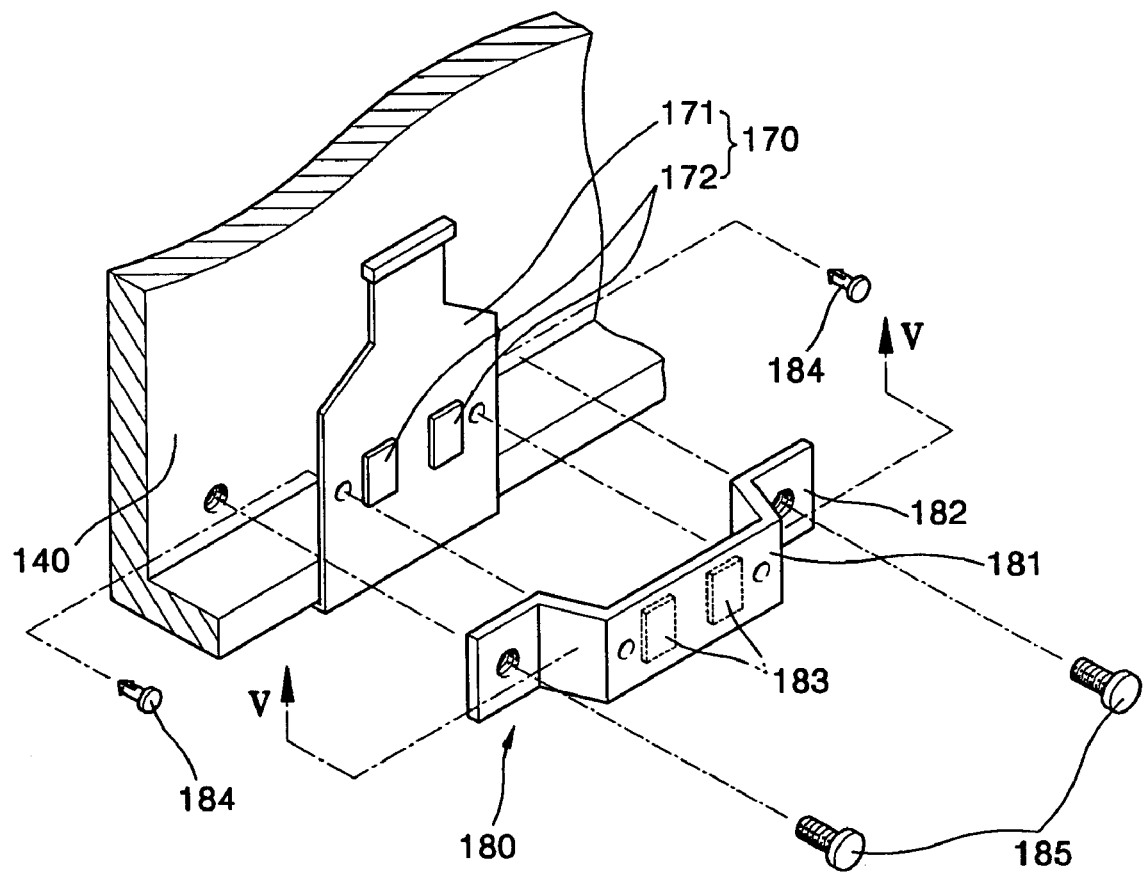
FIG. 4 is a partial exploded perspective view of a cover member shown in FIG. 1 as disposed on a signal transmission member.
Figure 5:
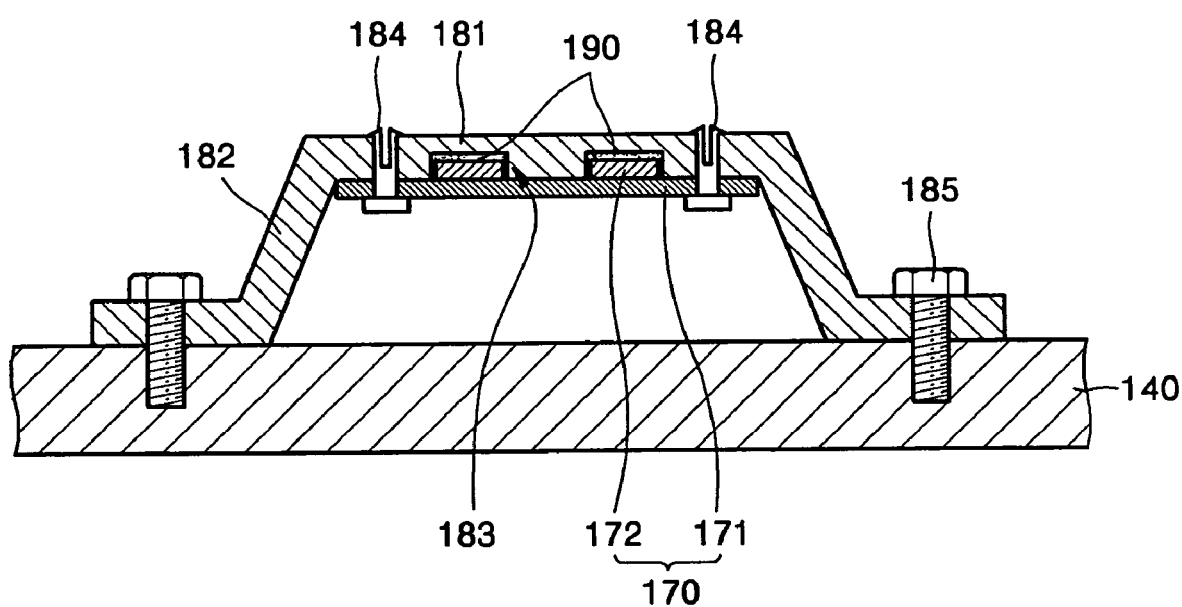
FIG. 5 is a partial cross-sectional view of the cover member taken along line V-V of FIG. 4.

FIG. 4 is a partial exploded perspective view of a cover member shown in FIG. 1 as disposed on a signal transmission member; and FIG. 5 is a partial cross-sectional view of the cover member taken along line V-V of FIG. 4.

Referring to FIGS. 4 and 5, the cover members 180 correspond to the TCPs 170 in a one-to-one correspondence so as to surround some parts of the TCPs 170. In addition, each of the cover members 180 includes a main body 181 which is formed in parallel with the TCP 170 so as to cover the devices 172, and extension units 182 extending from both ends of the main body 181 and bent.

In the latter regard, the main body 181 is fixed with the wiring unit 171 of the TCP 170 by a fixing member 184, and the extension units 182 are bent toward the chassis base 140 and are coupled to the chassis base 140 by screws 185. Accordingly, the devices 172 are covered and protected by the main body 181, and are separated from the chassis base 140, and thus the heat generated by the devices 172 is dissipated through convection. In addition, if the cover member 180, the chassis base 140, and the screw 185 are formed of the same metal material, the cover member 180 can be grounded to the chassis base 140. Accordingly, electromagnetic interference (EMI) generated by the devices 172 of the TCPs 170 can be absorbed and shielded by the cover member 180. In this respect, since the extension units 182 of the cover member 180 contact the surface of the chassis base 140, the grounding area of the cover member 180 is increased, and accordingly, the EMI shielding efficiency is improved.

The devices 172 covered by the main body 181 of the cover member 180 respectively protrude from the wiring unit 171 toward the main body 181, and recesses 183 are formed on the surfaces of the main body 181 in correspondence to the devices 172 so that the protruding devices 172 can be inserted therein. In this respect, the lower surface of the recesses 183 are closed, and the inner surfaces of the recess 183 and the outer surfaces of the device 172 are separated by predetermined distances from each other. The recess 183 is not limited the above example in that one recess, in which the two devices can be inserted commonly, can be formed.

Referring to FIG. 5, a heat conductive medium 190 is disposed at the recess 183 in a state where the device 172 is received in the recess. That is, liquid or gel-type heat conductive medium 190 is disposed between the protruding outer surfaces of the device 172 and the inner surfaces of the recess 183. A grease can be used as the heat conductive medium 190, the grease being formed by mixing a metallic soap and small amount of water into a liquid mineral oil so as to be a colloid, and the grease has a predetermined degree of viscosity. The grease may include synthetic oil such as silicon oil instead of the mineral oil.

The liquid or gel-type heat conductive medium 190 can be completely filled between the recess 183 and the device 172, and thus the heat generated by the device 172 is transmitted to the cover member 180 after passing through the heat conductive medium 190. Then, the heat is dissipated by being exchanged with the heat of the surrounding air. In addition, it is desirable that the heat conductive medium 190 have an appropriate viscosity so that the heat conductive medium 190 does not flow from the recess 183 in a state where the plasma display apparatus 100 is set up vertically.

The devices 172 received in the recesses 183, in which the heat conductive medium 190 is filled, are kept safe and protected, and sufficient heat dissipation of the devices 172 is performed. The opposite portions of the devices 172 are separated by a predetermined distance from the chassis base 140 so as to form a space, and thus the heat of the devices 172 can be dissipated by an exchanging operation with the surrounding air flowing in the space. Since the heat generated by the devices 172 of the TCPs 170 is dissipated sufficiently, the operational reliability of the devices 172 can be ensured. In addition, the cover members 180 are formed in a one-to-one correspondence with the TCPs 170, but each cover member 180 can commonly correspond to two or more TCPs.

As described above, according to the present invention, the cover member surrounds the device disposed on the signal transmission member, for example, the device disposed on the signal transmission member connecting the address driving unit of the circuit unit and the address electrodes in the plasma display panel driven in the HD single scan method, while the device is separated from the chassis base. Therefore, the device is protected, and the heat of the device is dissipated by convection. In addition, since the recess which receives the device is formed on the cover member and the heat conductive medium is disposed in the recess, the device is protected and sufficient heat dissipation is performed. Therefore, the operational reliability of the device is ensured.

While the present invention has been particularly shown and described with reference to exemplary embodiments thereof, it will be understood by those of ordinary skill in the art that various changes in form and detail may be made therein without departing from the spirit and scope of the present invention as defined by the following claims.

What is claimed is:

1. A plasma display apparatus, comprising:
a plasma display panel for displaying images;
a chassis base disposed at a rear portion of the plasma display panel;
a circuit unit disposed at a rear of the chassis base for driving the plasma display panel;
a plurality of signal transmission members, each of which includes at least one device, for connecting the plasma display panel and the circuit unit so as to transmit electric signals between the circuit unit and the plasma display panel, the signal transmission members being separated from each other; and
a plurality of cover members surrounding said at least one device of each of the signal transmission members while said at least one device of each of the signal transmission members is separated by a respective predetermined distance from the chassis base;
wherein each cover member includes a main body, and each signal transmission member is fixed to the main body of a respective cover; and
wherein each main body is formed in parallel with a respective one of the signal transmission members so as to cover said at least one device, and said each cover member includes extension units extending from both ends of the main body and bent toward the chassis base.

2. The apparatus of claim 1, wherein the cover members are disposed so as to correspond to the signal transmission members in a one-to-one correspondence.

3. The apparatus of claim 2, wherein a recess having a lower surface which is closed is formed insaid each cover member for receiving said at least one device.

4. The apparatus of claim 3, further comprising one of a liquid heat conductive medium and a gel-type heat conductive medium disposed between said at least one device and the recess.

5. The apparatus of claim 4, wherein the heat conductive medium comprises grease.

6. A plasma display apparatus, comprising:
a plasma display panel for displaying images;
a chassis base disposed at a rear portion of the plasma display panel;
a circuit unit disposed at a rear of the chassis base for driving the plasma display panel;
a plurality of signal transmission members, each of which includes at least one device, for connecting the plasma display panel and the circuit unit so as to transmit electric signals between the circuit unit and the plasma display panel, the signal transmission members being separated from each other; and
a plurality of cover members surrounding said at least one device of each of the signal transmission members while said at least one device of each of the signal transmission members is separated by a respective predetermined distance from the chassis base;
wherein each cover member includes a main body and extension units extending from both ends of the main body and bent toward the chassis base; and
wherein the extension units are fixed on the chassis base.

7. A plasma display apparatus, comprising:
a plasma display panel for displaying images;
a chassis base disposed at a rear portion of the plasma display panel;
a circuit unit disposed at a rear of the chassis base for driving the plasma display panel;
a plurality of signal transmission members, each of which includes at least one device, for connecting the plasma display panel and the circuit unit so as to transmit electric signals between the circuit unit and the plasma display panel, the signal transmission members being separated from each other; and
a plurality of cover members surrounding said at least one device of each of the signal transmission members while said at least one device of each of the signal transmission members is separated by a respective predetermined distance from the chassis base;
wherein the plasma display panel comprises:
a front substrate;
a front dielectric layer formed on a rear surface of the front substrate;
pairs of sustain electrodes embedded in the front dielectric layer;
a protective layer formed on a rear surface of the front dielectric layer;
a rear substrate facing the front substrate;
a rear dielectric layer formed on a front surface of the rear substrate;
address electrodes embedded in the rear dielectric layer and crossing the pairs of sustain electrodes;
barrier ribs formed on the rear dielectric layer so as to define discharge spaces; and
a phosphor layer disposed in the discharge spaces; and
wherein the circuit unit includes an address driving unit which comprises means for driving the plasma display panel in a high definition (HD) single scan mode; and
wherein each cover member includes a main body and extension units extending from both ends of the main body and bent toward the chassis base.

* * * * *